United States Patent [19]
Wright

[11] Patent Number: 6,142,866
[45] Date of Patent: Nov. 7, 2000

[54] METHOD AND APPARATUS FOR PROVIDING AIR CIRCULATION CONTROL FOR A BASE TRANSCEIVER STATION

[75] Inventor: Jonathan Wright, Irving, Tex.

[73] Assignee: Nokia Telecommunications, OY, Espoo, Finland

[21] Appl. No.: 09/271,940

[22] Filed: Mar. 18, 1999

[51] Int. Cl.[7] ............................................ H05K 7/20
[52] U.S. Cl. .................. 454/184; 165/80.3; 165/122; 361/691
[58] Field of Search ............................ 454/184; 361/641; 165/80.3, 122

[56] References Cited

U.S. PATENT DOCUMENTS

| | | | |
|---|---|---|---|
| 5,544,012 | 8/1996 | Koike | 454/184 X |
| 5,559,673 | 9/1996 | Gagnon et al. | 454/184 X |
| 5,793,610 | 8/1998 | Schmitt et al. | 361/695 |
| 5,890,959 | 8/1999 | Pettit et al. | 454/184 |

FOREIGN PATENT DOCUMENTS

| | | | |
|---|---|---|---|
| 4-10697 | 1/1992 | Japan | 361/695 |
| 4-116998 | 4/1992 | Japan | 361/695 |

*Primary Examiner*—Harold Joyce
*Attorney, Agent, or Firm*—Altera Law Group, LLC

[57] ABSTRACT

An air circulation control apparatus and method for a system such as a Base Transmission (or Transceiver) System (BTS) provides a control of an ambient air flow between inside and outside of the system. The apparatus includes at least one controller, such as a fan, and a member along an air flow path of the system. The member may be moveably mounted on the inside wall of the system. The controller operates in a forcing mode or a drawing mode to open or close the member so as to allow or not allow the air flow between inside and outside of the system.

13 Claims, 2 Drawing Sheets

METHOD AND APPARATUS FOR PROVIDING AIR CIRCULATION CONTROL FOR A BASE TRANSCEIVER STATION

BACKGROUND OF THE INVENTION

1. Field of the Invention

This invention relates in general to a Base Transmission (or Transceiver) System or BTS, and more particularly to an air circulation control for the BTS.

2. Description of Related Art

Air circulation inside a Base Transmission (or Transceiver) System or BTS is vital for the dependability of a product in a hot environment. Accordingly, there is a need for a cooling design in a BTS. Also, under a very cold environment, such as a temperature specification of −33° C. etc., it is required that a BTS be preheated before the BTS is activated and that during a normal operation the BTS be heated internally.

Generally, the ambient air can enter a system such as a BTS through the following method: fans are turned on, and convection and ambient air flow results in air circulation in the BTS. Prior methods include air/cabinet heaters.

It can be seen then that there is a need for an apparatus and method to reduce the ambient air from entering into a system being heated or to prevent hot air from exiting the BTS It can also be seen that there is a need for a less expensive and more reliable apparatus and method to control the air conditions in a system, such as a BTS.

It can also be seen that there is a need for an apparatus and method for minimizing the ambient air entering into a system, increasing the ambient air in the system when the ambient air is needed under cooling conditions, and preventing hot air from exiting the system.

SUMMARY OF THE INVENTION

To overcome the limitations in the prior proposal, and to overcome other limitations that will become apparent upon reading and understanding the present specification, the present invention discloses an air circulation control apparatus for a system such as a Base Transmission (or Transceiver) System (BTS).

The present invention solves the above-described problems by providing an apparatus and method for controlling the air flow of a system, such as a BTS, depending on the changes in air temperature.

In one embodiment, the apparatus in accordance with the principles of the present invention includes: a fan disposed in an internal air flow of a system such as a BTS, and a member for controlling air flow path between inside and outside of the system, wherein the position of the member is moved between a first position and a second position by the fan. When the air temperature is cold, the fan closes the member to stop the air flow between the inside and the outside of the system. When the air temperature is hot, the fan opens the member to allow the air flow between the inside and the outside of the system.

Other embodiments of a apparatus in accordance with the principles of the present invention may include alternative or optional additional aspects. One such aspect of the present invention is that the fan can be disposed at an air intake of the system. The fan is capable of operating in a drawing mode and a blowing mode. In one embodiment, the apparatus may include a plurality of fans. In one arrangement, a primary fan is used to open and close the member, and a secondary fan or fans are used to circulate the internal air of the system. In an alternative arrangement no primary fan is used, and a secondary fan or fans are used to open and close the member as well as to circulate the internal air of the system.

Another aspect of the invention is that the member can be moveably connected to the inside walls of the air flow path. In one embodiment, the member is mounted proximate the air intake of the system. The member may also be moveably mounted on the fan.

Another aspect of the present invention is that the air circulation control apparatus maybe disposed at the air intake or at an exhaust port of a system.

One advantage of the present invention is that no electromechanical motor is required to heat and/or cool the system such as a BTS. Accordingly, the system is much cheaper. Further, the air circulation for the BTS is more reliable as it does not rely on the operation of an electromechanical motor or their associated mechanical and electrical parts.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description of the exemplary embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The present invention provides an apparatus and a method for controlling an air flow between inside and outside of a system, such as a Base Transmission (or Transceiver) System or BTS, within a hot or cold environment. The present invention used in a BTS is discussed in details below. It is appreciated that the BTS is one exemplary application of the present invention, and that many other applications can be used without departing from the principles of the present invention.

Figure 1:
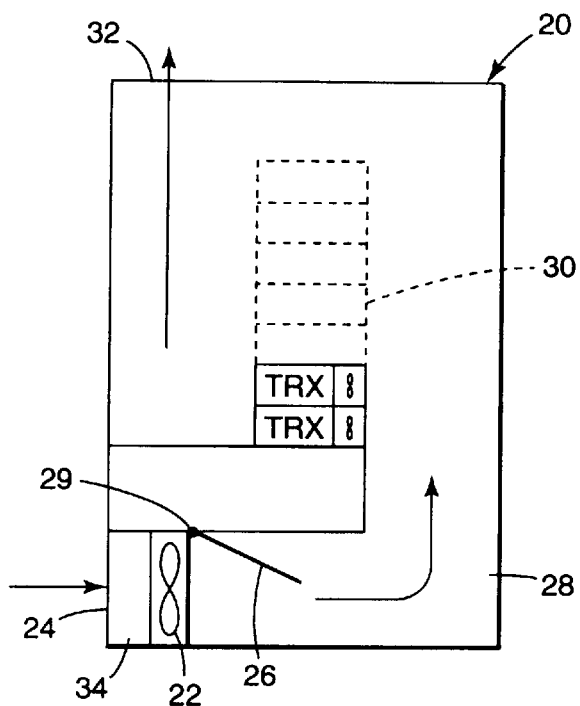
FIG. 1 illustrates a schematic view of one embodiment of an air circulation control system for a system such as a BTS when the BTS is in a hot environment, in accordance with the principles of the present invention.

Referring now to FIG. 1, an air circulation control apparatus in a BTS 20 is illustrated. The apparatus includes a controller 22 for controlling a member 26 to allow air flow within the BTS 20. The controller 22 is preferably a fan. Hereinafter, for clarity, the controller 22 will be described as being a fan. However, those skilled in the art will recognize that the present invention is not meant to be limited to using a fan to control the position of the member 26 for allowing air flow within the system 20.

For example, as shown in FIG. 1, a fan 22 may be located at an air intake 24 of the BTS 20. A member 26 is moveably mounted on the inside walls of an air flow path or duct 28 indicated by arrows. The connection between the member 26 and the inside walls of the air flow path 28 can be any conventional means, such as a hinge 29, etc. The member 26 may also be moveably mounted on the outside of the primary fan 22. Further, those skilled in the art will recognize that the member 26 may operate via the force of gravity, a spring mechanism, etc. to bias the member in an open or closed position. Those skilled in the art will recognize that the examples described with the drawings herein show the member 26 biased in a closed position. However, it will also be appreciated that the member 26 may be biased in an opened position with corresponding alteration in the operation of the fan (controller) 22.

Figure 2:
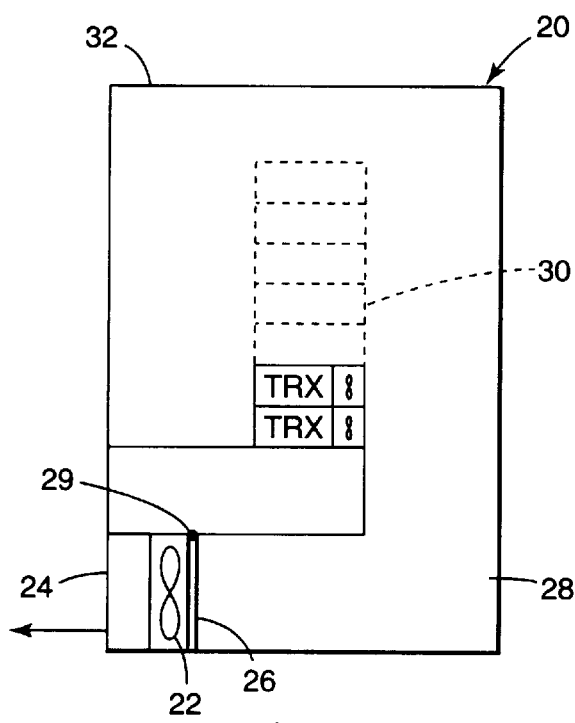
FIG. 2 illustrates a schematic view of one embodiment of an air circulation control system for a system such as a BTS when the BTS is in a cold environment, in accordance with the principles of the present invention.

When the member 26 is in an open position, the ambient air is allowed to flow into the air flow path 28 of the system. When the member 26 is in a close position, the ambient air is not allowed to flow into the system. The primary fan 22 can be operated in a drawing mode (as best seen in FIG. 2) and a blowing/forcing mode (as best seen in FIG. 1) to control the opening and closing of the member 26. When the primary fan 22 is in a drawing mode as shown in FIG. 2, the fan draws air from the air flow path (moves air current inward in a positive mode). The member 26 is forced to closed the air flow path 28. In this situation, ambient air is not allowed to enter into the BTS. This is especially useful in a cold temperature when the BTS is required to be preheated before activation. Those skilled in the art will recognize that the air flow path may be at an air intake port or at an air exhaust port.

On the other hand, when the primary fan 22 is in a blowing mode, the fan blows air into the air flow path (moves air current outward in a negative mode). The member 26 is forced to open the air flow path. In this situation, ambient air is allowed to enter into the BTS. This is especially useful in a hot temperature when the BTS is required to be cooled. It is appreciated that the primary fan may be adjusted to open the member at an angle between a fill close position and a fall open position depending on the desired temperature specification.

Also in FIGS. 1 and 2, the air circulation control apparatus also includes a plurality of secondary fans 30 disposed inside the BTS for internal air circulation and/or cooling. In FIG. 1, hot air can be blown out via an air outlet 32 of the BTS. The secondary fans 30 are arranged in an array-like manner as shown. It is appreciated that the arrangement of the primary fan and the secondary fans can be varied within the scope of the present invention. In FIG. 2, the secondary fans are switched off.

Figure 3:
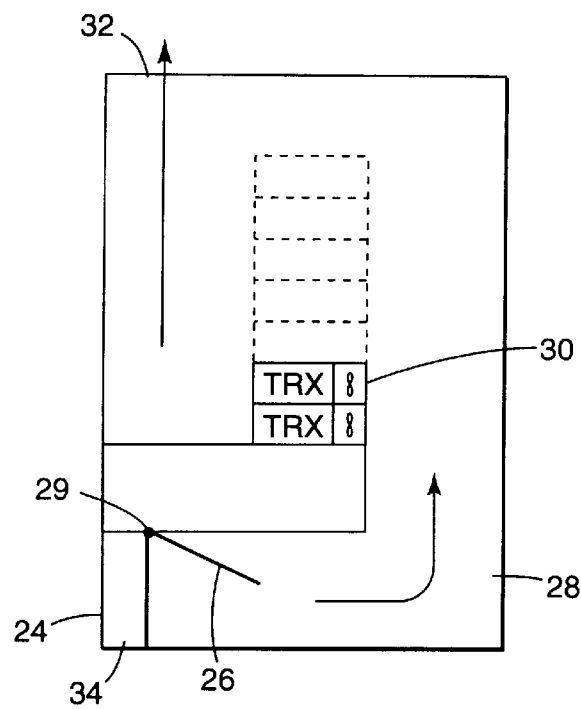
FIG. 3 illustrates a schematic view of a second embodiment of an air circulation control system for a system such as a BTS when the BTS is in a hot environment, in accordance with the principles of the present invention.
Figure 4:
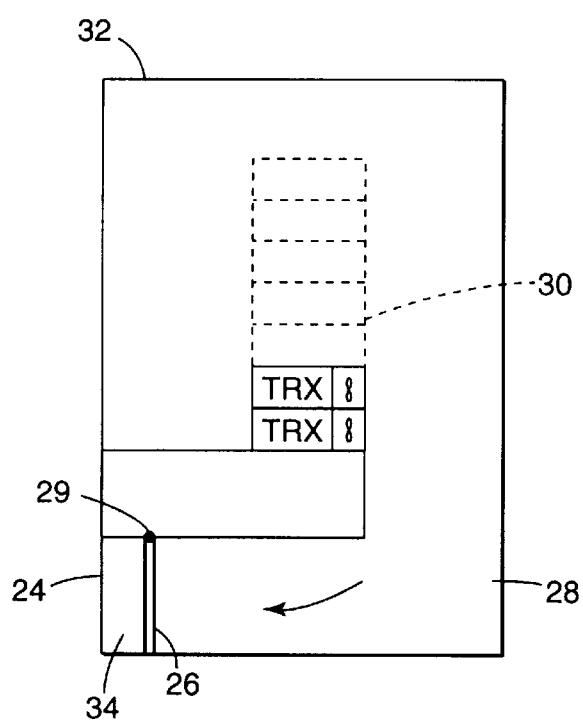
FIG. 4 illustrates a schematic view of the second embodiment of an air circulation control system for a system such as a BTS when the BTS is in a cold environment, in accordance with the principles of the present invention.

FIGS. 3 and 4 illustrate another embodiment of the air circulation control apparatus and method wherein no primary fan is used, and only a plurality of secondary fans 30 are used. In FIG. 3, the BTS is under a hot air temperature. The secondary fans 30 draw ambient air into the air flow path 28 such that the member 26 is open. The ambient air is allowed to enter into the path, and the hot air is blown out via the air outlet 32 of the BTS. In FIG. 4, the BTS is under a cold air temperature. The secondary fans 30 blow air from the air flow path 28 such that the member 26 is closed. No ambient air is allowed to enter into the path.

The BTS may include a filter 34 proximate the air intake 24 to filter the ambient air.

It is appreciated that other arrangements and configurations for the fans can be used within the scope of the present invention. For example, the apparatus may include only one primary fan or one secondary fan, and a fan may be disposed at any position within the air flow path.

It is also appreciated that more than one member can be mounted along the air flow path.

It is further appreciated that the air circulation control apparatus can be used in other applications such as an engine compartment, or a generator enclosure, etc. in which an air flow path is defined.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. An air circulation control apparatus for a system having an air flow path, comprising:

an air intake positioned at a first end of the air flow path;

a member, moveably mounted along the air flow path, the member having a closed position and a rotational position, the rotational position defines an opening within the air flow path;

a fan for generating air flow disposed in the air flow path of the system, the fan having a reverse directional state and a forward directional state for controlling the position of the member; and an air outlet positioned at a second end of the air flow path, the air outlet having an open position for the ventilation of air.

2. The air circulation control apparatus of claim 1, wherein the fan having the reverse directional state creates a pulling action on the member, the pulling action pulling the member to the closed position.

3. The air circulation control apparatus of claim 1, wherein the member is mounted adjacent to the fan.

4. The air circulation control apparatus of claim 1, wherein the fan having the forward directional variable state creates a pushing action against the member controlling the rotational position of the member.

5. An air circulation control apparatus for a Base Transmission (or Transceiver) System (BTS) having an air flow path, comprising:

an air intake positioned at a first end of the air flow path;

at least one electronic device positioned approximately adjacent to the air flow path;

at least one first fan coupled to the electronic device for maintaining a desired operating temperature of the electronic device;

a second fan for generating air flow disposed within the air flow path of the BTS, the second fan having a directional state, the directional state defined as a reverse directional state and a forward directional state;

a member moveable mounted along the air flow path, the member having a closed position and a rotational position, the position by the state of the second fan, the controlled rotational position defines an opening within the air flow path; and an air outlet positioned at a second end of the air flow path, the air outlet having an open position for the ventilation of air.

6. The air circulation control apparatus of claim 5, wherein the second fan having the reverse directional state creates a pulling action on the member, the pulling action pulling the member to the closed position.

7. The air circulation control apparatus of claim 5, wherein the second fan having the forward directional variable state creates a pushing action on the member controlling the rotational position of the member.

8. The air circulation control apparatus of claim 5, wherein the member is mounted adjacent to the fan.

9. An air circulation control apparatus for a Base Transmission (or Transceiver) System (BTS) having an air flow path comprising:

an air intake positioned at a first end of the air flow path;

at least one electronic device positioned approximately adjacent to the air flow path;

at least one fan, the fan coupled to the electronic device for maintaining a desired operating temperature of the electronic device, the fan having a forward directional state and a reverse directional state;

a member, moveably mounted along the air flow path, the member having a closed position and a rotational position, the rotational position defines an opening within the air flow path; and an air outlet positioned at a second end of the air flow path, the air outlet having a open position for ventilating air.

10. The air circulation control apparatus of claim 9, wherein the at least one fan having the forward directional variable state creates a pulling action on the member controlling the rotational position of the member.

11. The air circulation control apparatus of claim 9, wherein the fan having the reverse directional state creates pushing action against the member, the pushing action forcing the member into the closed position.

12. A method of controlling air circulation for a system having an air flow path, comprising:

positioning an air intake at a first end of the air flow path;

positioning a member along the air flow path, the member having a closed position and a rotational position, the rotational position defines an opening within the air flow path;

operating a fan disposed in the air flow path, the fan having a reverse directional state and a forward directional state for controlling the position of the member; and positioning an air outlet at a second end of the air flow path, the outlet having an open position for the ventilation of air.

13. A method of controlling air circulation for a Base Transceiver Station (BTS) having an air flow path, comprising:

positioning an air intake at a first end of the air flow path;

positioning a member along the air flow path, the member having a closed position and a rotational position, the rotational position defines an opening within the air flow path;

positioning at least one electronic device approximately adjacent to the air flow path;

coupling at least one fan to the electronic device for maintaining a desired operating temperature of the electronic device;

operating a second fan disposed approximately adjacent to the air intake of the BTS, the second fan having a directional state, the directional state defined as a reverse directional state and a forward directional state;

positioning a member along the air flow path, the member having a closed position and a rotational position, the position controlled by the state of the second fan, the rotational position defines an opening within the air flow path; and positioning an air outlet at a second end of the air flow path, the air outlet having an open position for ventilating air.

* * * * *